United States Patent
Miyoshi

(10) Patent No.: US 9,673,360 B2
(45) Date of Patent: Jun. 6, 2017

(54) METHOD FOR MANUFACTURING LIGHT EMITTING DEVICE USING STRIP-SHAPED FIRST RESIN MEMBERS

(71) Applicant: Nichia Corporation, Anan-shi (JP)

(72) Inventor: Tomonori Miyoshi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/572,347

(22) Filed: Dec. 16, 2014

(65) Prior Publication Data

US 2015/0171267 A1   Jun. 18, 2015

(30) Foreign Application Priority Data

Dec. 17, 2013 (JP) .................................. 2013-260313

(51) Int. Cl.
| | |
|---|---|
| *H01L 33/54* | (2010.01) |
| *H01L 33/00* | (2010.01) |
| *H01L 25/075* | (2006.01) |
| *H01L 33/50* | (2010.01) |

(52) U.S. Cl.
CPC ............ *H01L 33/54* (2013.01); *H01L 33/005* (2013.01); *H01L 25/0753* (2013.01); *H01L 33/505* (2013.01); *H01L 2924/0002* (2013.01); *H01L 2933/005* (2013.01)

(58) Field of Classification Search
CPC ..... H01L 33/54; H01L 33/50; H01L 33/0095; H01L 33/005; H01L 2933/005; H01L 33/505; H01L 25/0753; H01L 2924/0002; H01L 2924/00

USPC ............................................... 257/98; 438/27
See application file for complete search history.

(56) References Cited

U.S. PATENT DOCUMENTS

| | | | |
|---|---|---|---|
| 2002/0187570 A1 | 12/2002 | Fukasawa et al. | |
| 2006/0186431 A1* | 8/2006 | Miki ................... | H01L 33/505 257/100 |
| 2008/0179503 A1 | 7/2008 | Camargo et al. | |
| 2010/0193822 A1 | 8/2010 | Inobe et al. | |
| 2010/0258830 A1 | 10/2010 | Ide et al. | |

(Continued)

FOREIGN PATENT DOCUMENTS

| | | |
|---|---|---|
| EP | 2 444 715 A2 | 4/2012 |
| JP | H06-077540 A | 3/1994 |

(Continued)

OTHER PUBLICATIONS

Extended European Search Report issued in European Patent Application No. 14198344.5 dated May 22, 2015.

*Primary Examiner* — Selim Ahmed
(74) *Attorney, Agent, or Firm* — Foley & Lardner LLP

(57) ABSTRACT

Provided is a method for manufacturing a light emitting device that can manufacture the light emitting device at low cost. The manufacturing method of a light emitting device includes: a mounting step of mounting a plurality of light emitting elements at predetermined intervals in one direction on a substrate; a first resin formation step of continuously forming a first resin layer in the one direction to directly cover the light emitting elements mounted; a trench formation step of forming a trench between the light emitting elements in a direction intersecting the one direction; and a second resin charging step of charging a second resin into the trench.

17 Claims, 7 Drawing Sheets

(56) References Cited

U.S. PATENT DOCUMENTS

| | | | |
|---|---|---|---|
| 2012/0104452 A1* | 5/2012 | Miyoshi | H01L 25/0753 257/99 |
| 2012/0112227 A1 | 5/2012 | Toyama | |
| 2012/0193651 A1 | 8/2012 | Edmond et al. | |
| 2012/0319150 A1* | 12/2012 | Shimomura | H01L 24/97 257/98 |
| 2013/0062644 A1* | 3/2013 | Ushiyama | H01L 33/60 257/98 |
| 2014/0131753 A1 | 5/2014 | Ishida et al. | |

FOREIGN PATENT DOCUMENTS

| | | |
|---|---|---|
| JP | H10-093132 A | 4/1998 |
| JP | 2001-177160 A | 6/2001 |
| JP | 2002-368281 A | 12/2002 |
| JP | 2012-069577 A | 4/2012 |
| JP | 2013-120821 A | 6/2013 |
| JP | 2013-197450 A | 9/2013 |
| WO | WO-2009/066430 A1 | 5/2009 |

* cited by examiner

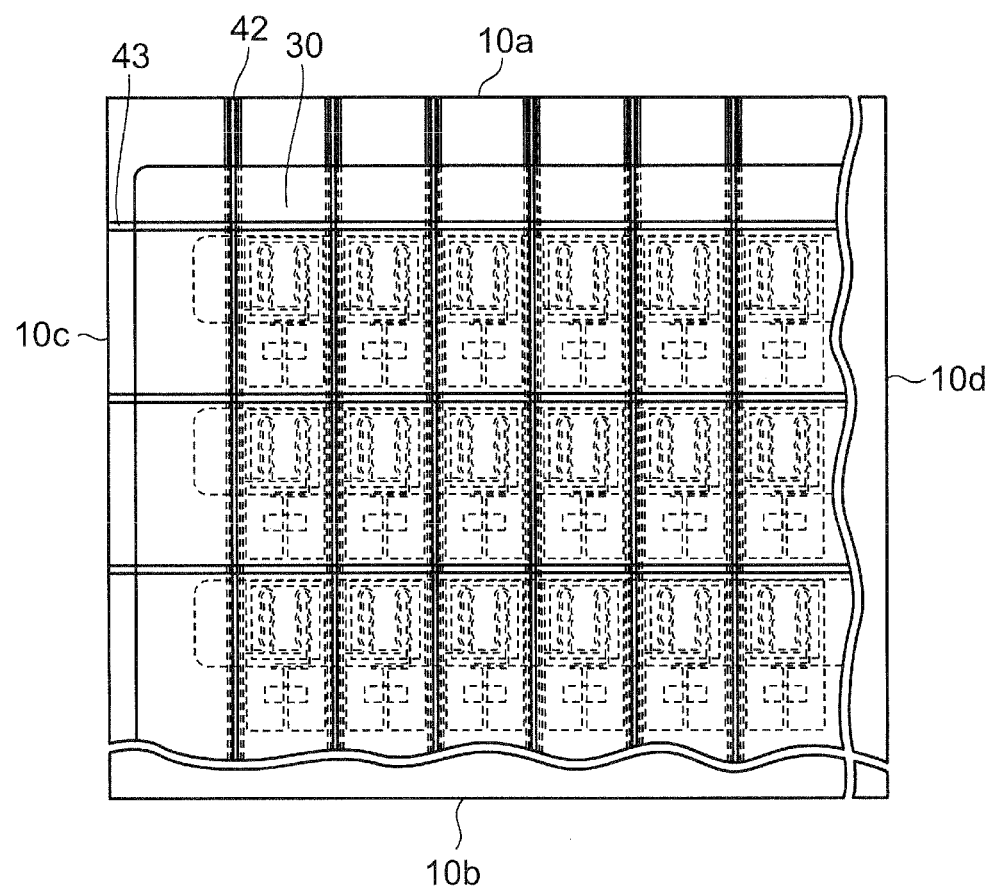

METHOD FOR MANUFACTURING LIGHT EMITTING DEVICE USING STRIP-SHAPED FIRST RESIN MEMBERS

CROSS-REFERENCE TO RELATED APPLICATION

The present application claims priority under 35 U.S.C section 119 to Japanese Patent Application No. 2013-260313, filed on Dec. 17, 2013. The contents of this application are incorporated herein by reference in their entirely.

BACKGROUND OF THE INVENTION

Field of the Invention

The disclosure relates to a method for manufacturing a light emitting device, and a light emitting device manufactured by using the same.

Description of Related Art

Light emitting devices including a semiconductor light emitting element, typified by a light emitting diode (LED), have a very excellent energy saving effect and can be used semipermanently, as compared to existing light sources. For this reason, the light emitting devices have been widely applied to varying fields, for example, a backlight, a vehicle, a lighting board, a traffic light, other generic illuminations, and the like.

As one example of the light emitting device using the LED, in order to ensure a high front brightness, a light emitting device is proposed which includes a light emitting element, a light transmissive member disposed above the light emitting element, and a reflective member covering side surfaces of the light emitting element and the light transmissive member (see, for example, JP 2013-197450 A).

Specifically, in the light emitting device disclosed in JP 2013-197450 A, a wavelength conversion layer is formed on an upper surface of the light emitting element mounted on a substrate, a light transmissive plate-like member is mounted on the wavelength conversion layer, and the light reflective member is formed around the light emitting element, wavelength conversion layer, and light transmissive plate-like member.

It is described in JP 2013-197450 A that the light emitting device is fabricated as follows.

First, a flip-chip light emitting element is mounted on the upper surface of the substrate.

Then, uncured resin for forming the wavelength conversion layer is supplied in a predetermined amount to the upper surface of the light emitting element.

Subsequently, the light transmissive plate-like member whose size is slightly larger than the upper surface of the light emitting element is mounted, and the resin is cured.

Thereafter, the light reflective member is formed to cover the side surfaces of the wavelength conversion layer and the side surfaces of the light transmissive plate-like member.

However, in the manufacturing method of the light emitting device of JP 2013-197450 A, uncured resin for forming the wavelength conversion layer is applied to each of the light emitting elements mounted, and the light transmissive plate-like member is mounted on each light emitting element via the resin, which leads to an increase in the number of steps, making it difficult to manufacture the light emitting device at low cost.

SUMMARY OF THE INVENTION

Accordingly, it is an object of the present invention to provide a method for manufacturing a light emitting device that can manufacture the light emitting device at low cost, and a low-cost light emitting device with a high luminance.

To achieve the foregoing object, a manufacturing method of a light emitting device according to a first aspect of the present invention includes:

a mounting step of mounting a plurality of light emitting elements at predetermined intervals in one direction on a substrate;

a first resin formation step of continuously forming a first resin layer in the one direction to directly cover the light emitting elements mounted;

a trench formation step of forming a trench between the light emitting elements in a direction intersecting the one direction; and a second resin charging step of charging a second resin into the trench.

Further, a manufacturing method of a light emitting device according to a second aspect of the present invention includes:

a mounting step of mounting a plurality of light emitting elements at predetermined intervals in one direction on a substrate;

a first resin formation step of forming a first resin layer by screen printing to directly cover the light emitting elements;

a trench formation step of forming a trench between the light emitting elements in a direction intersecting the one direction; and a second resin charging step of charging a second resin into the trench.

A light emitting device according to a first aspect of the present invention includes:

a substrate, a light emitting element provided on the substrate, a first resin layer provided on the substrate to directly cover the light emitting element, and a second resin layer provided so as to surround side surfaces of the first resin layer, wherein the side surfaces of the first resin layer include a first side surface and a second side surface, and the first side surface and the second side surface differ from each other in inclination angle with respect to the substrate.

Further, a light emitting device according to a second aspect of the present invention includes:

a substrate, a light emitting element provided on the substrate, a first resin layer provided on the substrate to directly cover the light emitting element, and a second resin layer provided so as to surround side surfaces of the first resin layer, wherein the side surfaces of the first resin layer include a first side surface and a second side surface, and at least one of the first side surface and the second side surface has an inclination angle decreased toward the substrate.

The methods for manufacturing a light emitting device according to the first and second aspects of the present invention can manufacture the light emitting device at low cost.

Further, according to the light emitting devices of the first and second aspects of the present invention, a low-cost light emitting device with a high luminance can be provided.

BRIEF DESCRIPTION OF THE DRAWINGS

FIG. 1G is a plan view of the step of forming first separation trenches and second separation trenches to separate the substrate in the manufacturing method of the embodiment.

DETAILED DESCRIPTION OF THE EMBODIMENTS

Preferred embodiments according to the present invention will be described below with reference to the accompanying drawings.

Figure 2A:
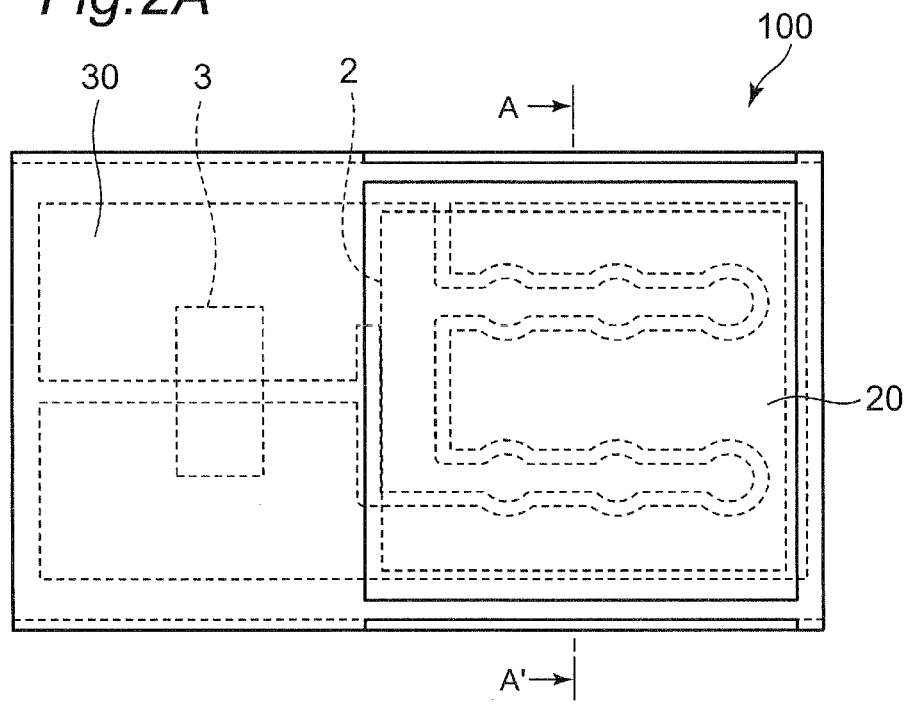
FIG. 2A is a schematic plan view showing the structure of a light emitting device in the embodiment of the present invention.

As shown in FIG. 2, a light emitting device 100 of this embodiment includes a light emitting element 2, a semiconductor element 3, a light transmissive first resin layer 20 covering the light emitting element 2, and a second resin layer 30 provided around the first resin layer 20 on a substrate 5. In the present specification, the term "on" refers to not only "in direct contact with" but also "in indirect contact with". For Example, one or more another layers may be formed between the first resin layer 20 and a substrate 5. The second resin layer 30 covers the entire upper surface of the substrate 5 except for the upper surface of the first resin layer 20. In the light emitting device 100, the upper surface of the first resin layer 20 surrounded by and exposed from the second resin layer 30 forms a light emitting surface. In the thus-formed light emitting device 100, the light emitting surface is surrounded by the second resin layer 30, which allows light emitted from the light emitting element to efficiently emanate from the light emitting surface, thereby achieving a high front brightness. The first resin layer 20 is preferably formed on the light emitting element 2 so as to directly cover (contact with) the light emitting element 2.

The light emitting device 100 of this embodiment can be fabricated by the following manufacturing method. The manufacturing method can provide the low-cost light emitting device with the high luminance and good parting visibility.

A manufacturing method of a light emitting device in this embodiment involves collectively fabricating a plurality of light emitting devices on an aggregate substrate, and then separating the substrate into the individual light emitting devices. Specifically, the manufacturing method includes the following steps.

1. Substrate Fabrication Step

Figure 1A:
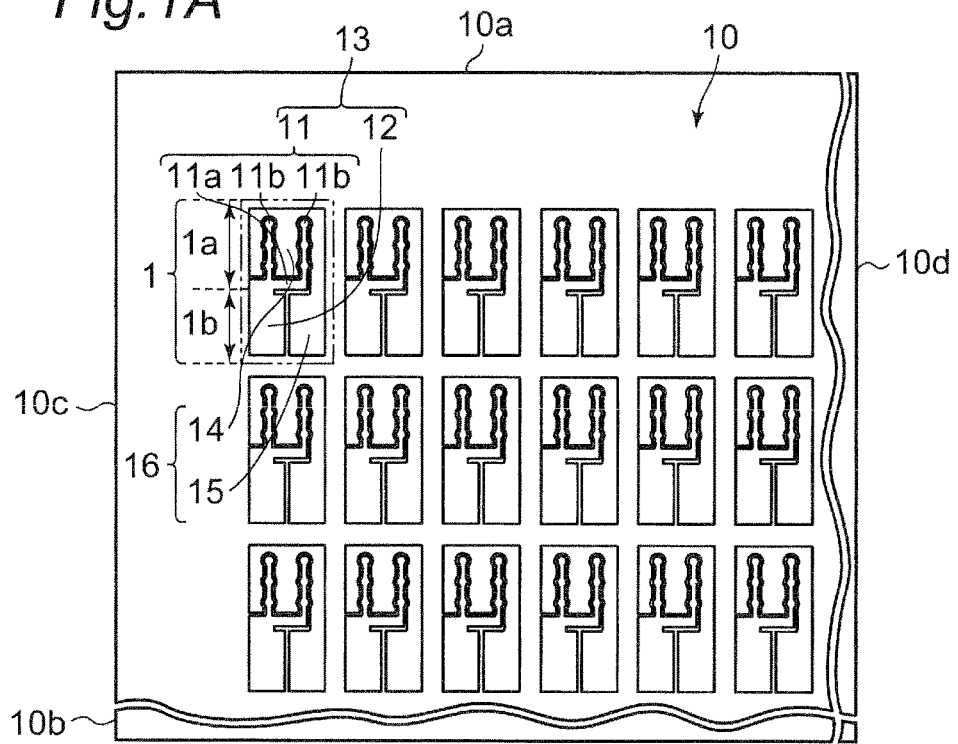
FIG. 1A is a plan view of an aggregate substrate in a manufacturing method according to one embodiment of the present invention.

As shown in FIG. 1A, there is provided an aggregate substrate 10 that includes a negative electrode 13 and a positive electrode 16 respectively formed in a unit region 1 corresponding to an individual light emitting device. The aggregate substrate 10 includes a plurality of unit regions 1 arranged in a matrix. Each unit region 1 is a rectangular region. In each unit region 1, the light emitting elements 2 and the semiconductor elements 3 are arranged side by side in the longitudinal direction of the unit region. In each unit region 1, as shown in FIG. 1, hereinafter, a region provided with the light emitting element 2 is referred to as a first region 1a, and a region provided with the semiconductor element 3 is referred to as a second region 1b. The expression "arrangement of the unit regions 1 in a matrix" as used herein means that the unit regions 1 are arranged in the direction (first direction) perpendicular to the longitudinal direction of the unit region 1, while the unit regions 1 are also arranged in the longitudinal direction (second direction) of the unit region 1.

The negative electrode 13 includes a first negative electrode 11 positioned in the first region 1a, and a second negative electrode 12 positioned in the second region 1b. The first negative electrode 11 includes a first extending electrode 11a extending in the direction perpendicular to the longitudinal direction of the unit region 1, and two second extending electrodes 11b extending from the first extending electrode 11a in the longitudinal direction of the unit region 1.

The second extending electrode 11b has a plurality of bump connecting portions with a wider width.

The positive electrode 16 includes a first positive electrode 14 positioned in the first region 1a, and a second positive electrode 15 positioned in the second region 1b. The first positive electrode 14 is formed across an entire region of the first region 1a which is located apart from the first negative electrode 11 by a predetermined distance and in which no first negative electrode 11 is formed.

The second negative electrode 12 and the second positive electrode 15 are axisymmetric with respect to the center line in the longitudinal direction of the unit region 1.

As mentioned above, either the negative electrode 13 or the positive electrode 16 is formed in the unit region 1 of the aggregate substrate 10, except for an isolation portion with a predetermined width for isolating the negative electrode 13 and the positive electrode 16 from each other.

2. Light Emitting Element Mounting Step

The light emitting element 2 is mounted on each unit region 1 of the aggregate substrate 10.

Figure 1B:
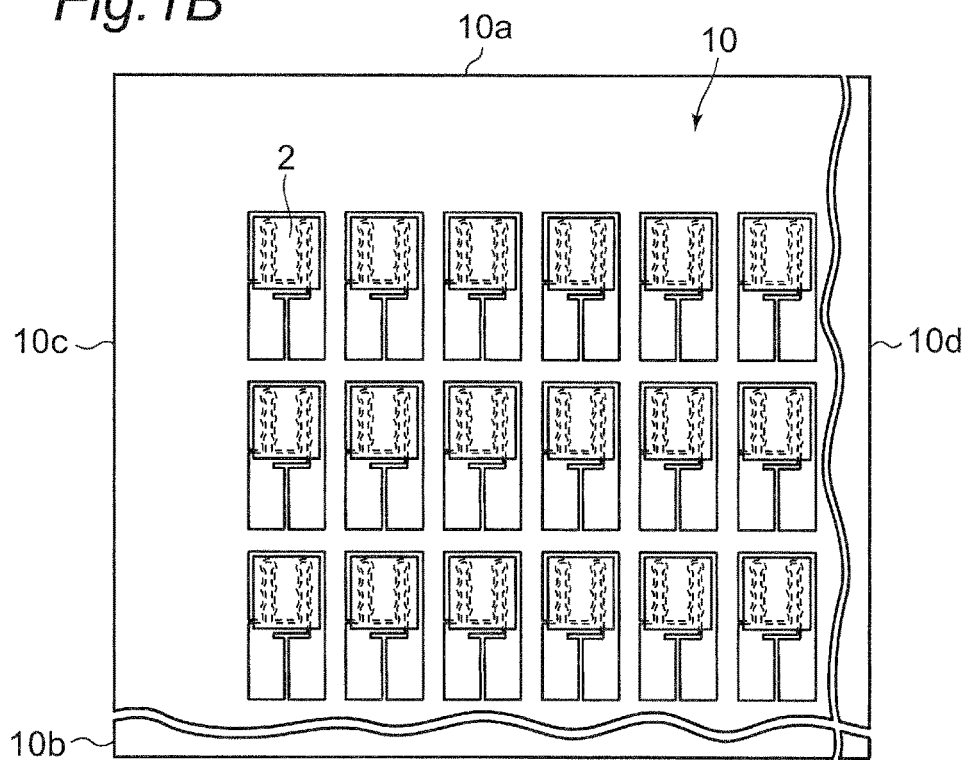
FIG. 1B is a plan view of the step of mounting light emitting elements and semiconductor elements in the manufacturing method of the embodiment.

As shown in FIG. 1B, first, the light emitting element 2 is mounted in the first region 1a of each unit region 1 such that an n-electrode of the light emitting element 2 is connected to the first negative electrode 11 in the unit region 1, while a p-electrode of the light emitting element 2 is connected to the first positive electrode 14 in the unit region 1.

Specifically, for example, bumps are respectively formed in the bump connecting portions of the two second extending electrodes 11b and in the bump connecting portions of the first positive electrode 14, so that via these bumps, the n-electrode of the light emitting element 2 is connected to the bump connecting portions of the second extending electrode 11b, and the p-electrode of the light emitting element 2 is connected to the bump connecting portions of the first positive electrode 14. The bump connecting portions of the second extending electrode 11b are provided in three positions (as circular parts) of each second extending electrode 11b. The bump connecting portions of the first positive electrode 14 are respectively provided, for example, between the two second extending electrodes 11b and outside the second extending electrodes 11b.

3. First Resin Layer Formation Step

Figure 1C:
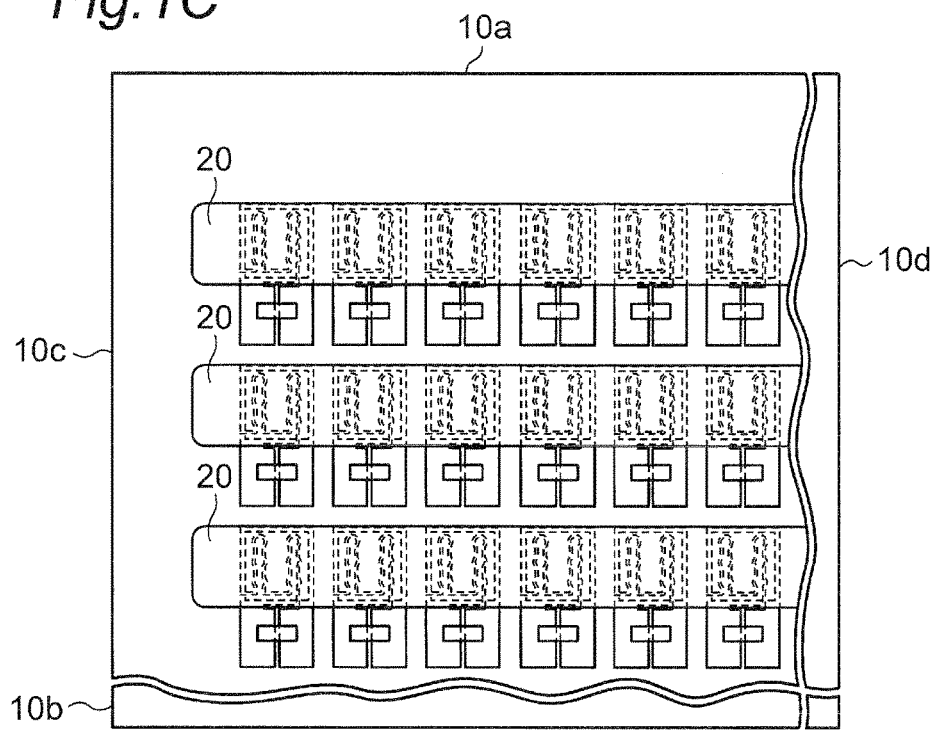
FIG. 1C is a plan view of the step of forming a first resin layer in the manufacturing method of the embodiment.

Next, as shown in FIG. 1C, a first resin layer 20 is formed in a continuous (for example, a strip-like) shape in one direction to collectively cover the light emitting elements 2 that are mounted in the unit regions 1 arranged in the first direction. Suitable material for the first resin layer can be a silicone resin containing a YAG phosphor. The first resin layer 20 is formed, for example, by screen printing. The first resin layer 20 formed in this way does not have parts having significant differences in height, but has an upper surface thereof with small concave and convex portions. That is, the surface of a part of the first resin layer 20 formed above the light emitting element 2 is made higher (in a convex shape), and the surface of a part between the adjacent light emitting elements 2 is made lower (in a concave shape). When forming the first resin layer 20 by the screen printing, for example, a viscosity of resin paste (resin before curing) for use in printing is adjusted to, for example, 200 to 600 Pa·s, preferably, approximately 400 Pa·s. Such adjustment of the viscosity defines the shape of the convex and concave portions at the upper surface of the first resin layer 20, specifically, clarifies a difference in height between the convex and concave portions to thereby define the shape of the upper surface of the convex portion with high accuracy. The shape of the upper surface of the convex portion corresponds to the shape of a light emitting surface of the light emitting device. This embodiment can mass-produce the light emitting devices having the same shape of the light emitting surface.

Thereafter, the first resin layer is heated and cured.

In this embodiment, the first resin layer 20 is formed in the strip-like shape, but the present invention is not limited thereto. For example, the first resin layer may be formed on each light emitting element 2. Alternatively, a plurality of first resin layers may be formed to seal the light emitting elements 2 arranged in one line (that is, each of the first resin layers may be formed along the line)

The first resin layer 20 may contain another phosphor that absorbs at least a part of the light emanating from the light emitting element 2 to emit light with a different wavelength. This can achieve the light emitting device that emits lights in various colors different from the color of the light from the light emitting element.

Although in this embodiment, the first resin layer is formed by the screen printing, the present invention is not limited thereto as long as the first resin layer can be continuously formed to cover the light emitting elements in one direction. For example, the first resin layer can also be formed by transfer molding or compression molding using a die, spraying, or the like. In addition, a sheet-like resin separately formed can also be used.

4. Semiconductor Element Mounting Step

Then, the semiconductor element 3 is mounted in the second region 1b of each of the unit regions 1.

The semiconductor element 3 is respectively connected to the second negative electrode 12 positioned in the second region 1b, and the second positive electrode 15 positioned in the second region 1b, for example, via the bumps. The semiconductor element 3 may be mounted before the first Resin Layer Formation Step. In this case, the first resin layer 20 is formed without covering the semiconductor elements 3.

5. First Trench Formation Step

Figure 1D:
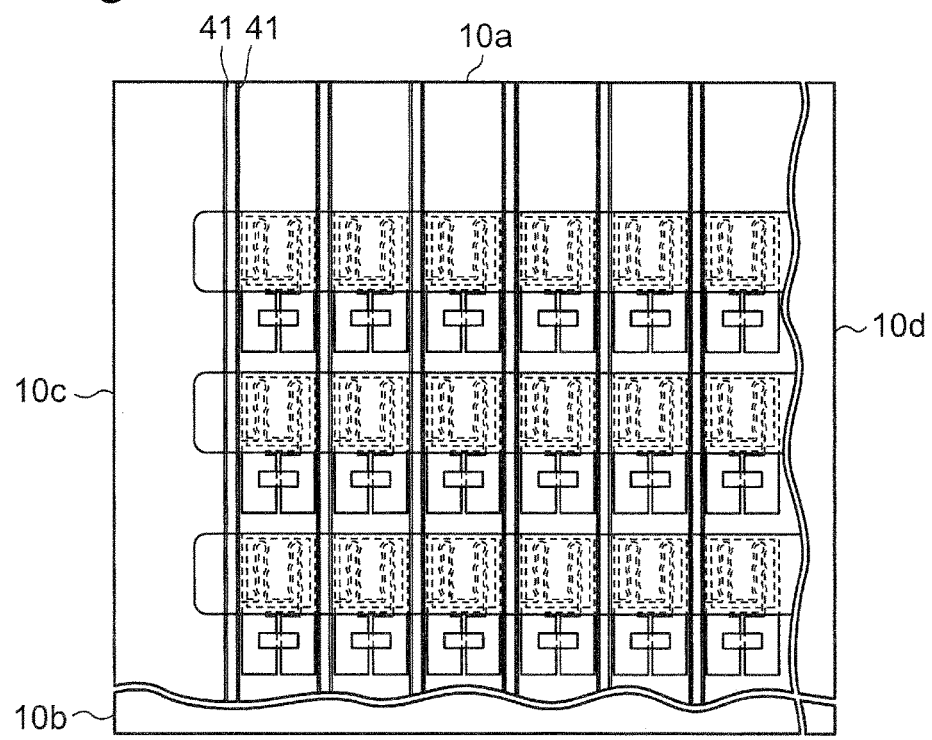
FIG. 1D is a plan view of the step of forming first trenches in the manufacturing method of the embodiment.

Then, as shown in FIG. 1D, trenches 41 (each hereinafter referred to as a "first trench 41") are formed in parallel to the long side of the unit region 1. Each trench 41 leads from a first side surface 10a of the aggregate substrate 10 to a second side surface 10b thereof along the long side of the unit region 1, and extends to reach the aggregate substrate 10 from the surface of the first resin layer 20.

The position in which the first trench 41 is formed defines the thickness of the first resin layer 20 formed at the side surface of the light emitting element 2 in the light emitting device when finally separating the substrate into the individual light emitting devices. Thus, the position in which the first trench 41 is formed is set based on the thickness of the first resin layer 20 formed at the side surface of the light emitting element 2 in the light emitting device.

The width of the first trench 41 is set based on the necessary thickness of the second resin layer that is formed outside the first resin layer 20 formed at each side surface of the light emitting element 2 when the substrate is separated into the individual light emitting devices.

In the following step, second resin preferably penetrates into the first trench 41 by capillary action. For this reason, the width of the first trench 41 is preferably set at one that allows the second resin to penetrate into the trench by the capillary action.

Further, a plurality of the first trenches 41 may be formed between the unit regions 1 arranged adjacent to each other in the first direction. Preferably, as shown in FIG. 1D, there are two first trenches 41 one of which is formed along the long side of one of the adjacent unit regions 1 in the first direction, and the other of which is formed apart from the above first trench along the long side of the one unit region 1. With this arrangement, the width of the first trench can be adjusted. Thus, the first trenches can be effectively formed even though the second resin layer is thick.

The first trench 41 is formed in such a depth as to reach at least the surface of the aggregate substrate 10. Particularly, the first trench is preferably formed in the depth that reaches the midway of the aggregate substrate 10 in the thickness direction through the surface of the aggregate substrate 10 so as to surely cover the side surfaces of the first resin layer with the second resin layer. In this way, the trenches are formed in the substrate, which can enhance the adhesion between the aggregate substrate 10 and the second resin filling the trenches, thereby forming the light emitting device with higher reliability.

6. Second Resin Layer Formation Step

Figure 1E:
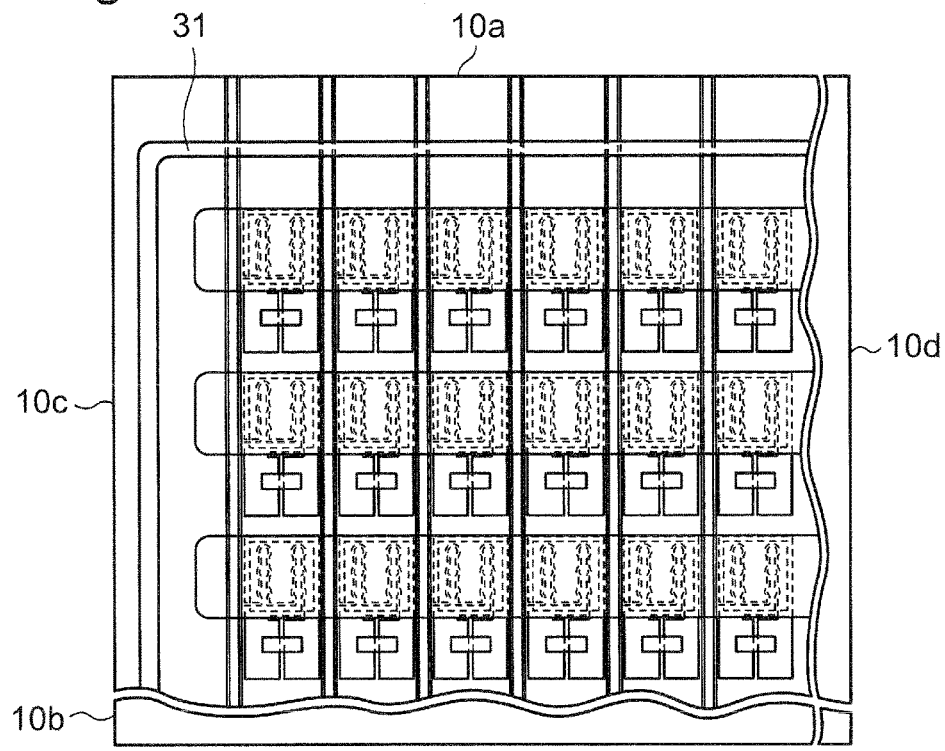
FIG. 1E is a plan view of the step of forming a resin frame in the manufacturing method of the embodiment.
Figure 1F:
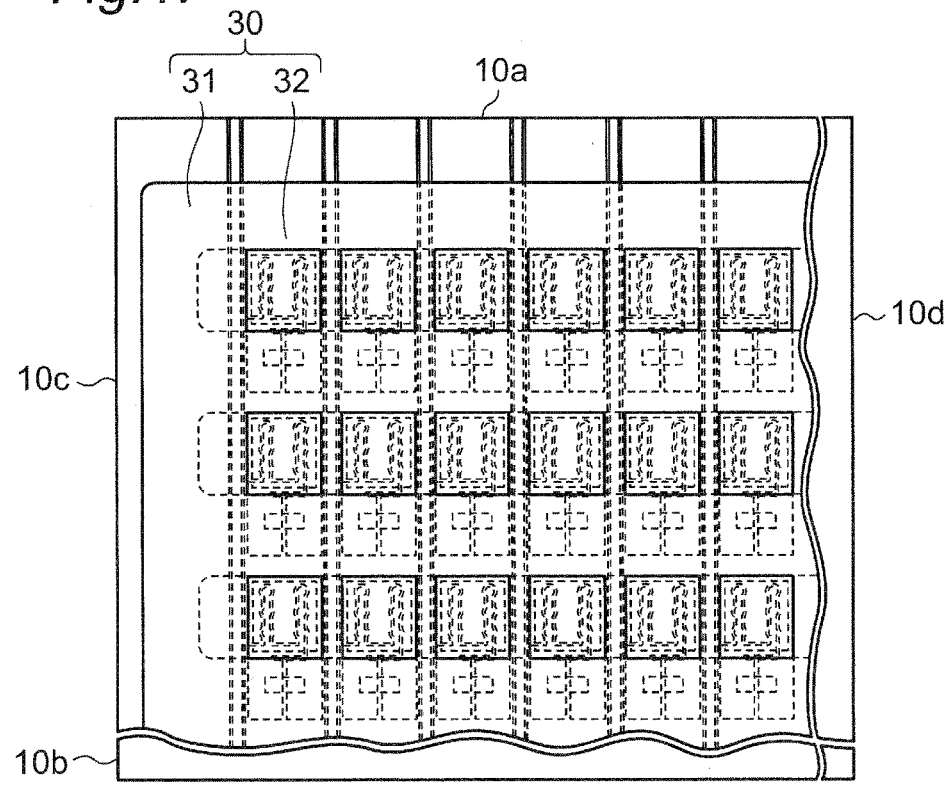
FIG. 1F is a plan view of the step of forming of a second resin layer formed in the manufacturing method of the embodiment.

As shown in FIGS. 1E and 1F, the second resin layer 30 is formed.

Suitable material for the second resin layer can be a silicone resin containing titanium oxide.

First, as shown in FIG. 1E, a resin frame 31 is formed of the second resin to surround all of the unit regions 1 in which the light emitting element 2 and the semiconductor element 3 are respectively mounted (in the step of forming the resin frame). The resin frame 31 can be formed, for example, by a dispensing process.

A viscosity of the second resin before curing in the resin frame formation step is set at, for example, 200 to 600 Pa·s, and preferably to about 400 Pa·s.

Then, as shown in FIG. 1F, the second resin is poured into a part (concave portion) of the region surrounded by the resin frame 31 except for the upper surface of the convex portion above the semiconductor element 2, followed by holding for a certain period of time until the second resin penetrates into the first trench 41 by the capillary action, and then the second resin is heated and cured (second resin charging step). At this time, the semiconductor element 3 is covered with the second resin. A viscosity of the second resin before curing in the second resin charging step is set at, for example, 10 Pa·s or less, and preferably to about 4.5 Pa·s.

In this way, a second resin layer 32 is formed inside the resin frame 31, so that the second resin layer 30 is formed of the resin frame 31 and the second resin layer 32 which are integral with each other. The second resin layer 30 may directly cover the semiconductor elements 3.

The second resin layer preferably includes the reflective member. Thus, the reflective member included in the second resin layer can effectively emit the light from the upper surface (light emitting surface) of the first resin layer, thereby achieving the light emitting device with the high luminance. Further, the second resin layer includes the reflective member, which can clearly define the end of the light emitting surface of the first resin layer to achieve the light emitting device with the high luminance and good parting.

In the embodiments mentioned above, the resin frame 31 and the second resin layer 32 are formed of the same resin. However, the present invention is not limited thereto. Alternatively, the resin frame 31 and the second resin layer 32 can also be formed of different resins or materials.

In the embodiments mentioned above, after the resin frame is formed, the second resin is poured into the resin frame to form the second resin layer. However, the present invention is not limited thereto, and the second resin layer can also be formed without using the resin frame.

7. Separation Step

The light emitting devices fabricated in an aggregated state are individually separated from each other.

The separation way is not specifically limited. Specifically, as shown in FIG. 1G, the substrate is separated by forming a first separation trench 42 at the center between the unit regions 1 adjacent to each other in the first direction, and a second separation trench 43 at the center between the unit regions 1 adjacent to each other in the second direction. For example, in the structure of this embodiment with two first trenches 41 along one side, the first separation trench 42 is formed between the first trenches 41, for example not to be in contact with the first trenches 41.

In the way mentioned above, the light emitting device 100 of the embodiment shown in FIG. 2 is manufactured in which the upper surface of the first resin layer 20 serves as a light emitting surface with the surroundings of the light emitting surface embedded in the second resin layer 30.

In the manufacturing method of the light emitting device in this embodiment of the present invention mentioned above, the first resin layer for the respective light emitting elements can be collectively formed at one time, which can decrease the number of steps, thereby manufacturing the light emitting device at low cost, for example, as compared to a method which involves mounting a light transmissive plate-like member for each light emitting element.

When intended to manufacture a light emitting device that emits light in a different color from that of the light emitted from the original light emitting element by containing a phosphor in the first resin layer 20 in the manufacturing method of the light emitting device in the embodiment of the present invention, the phosphor contained in the first resin layer 20 is selected from among various phosphors according to a desired emission color. Thus, the light emitting devices that can emit lights in various emission colors can be achieved by the same manufacturing method.

The formation width and shape of the strip-like first resin layer 20 continuously formed in one direction as well as the formation position of the first trench can be appropriately selected according to requested specifications. Thus, the light emitting devices having various sizes can be manufactured according to the requested specifications.

Therefore, the manufacturing method of the light emitting device in the embodiment of the present invention can manufacture various types of light emitting devices according to needs, and thus can produce the low-cost light emitting device that satisfies the needs for high-mix low-volume production.

The light emitting device 100 is fabricated by the above-mentioned manufacturing method, and thus has the features of the shape of the first resin layer 20 depending on the manufacturing method.

Figure 2B:
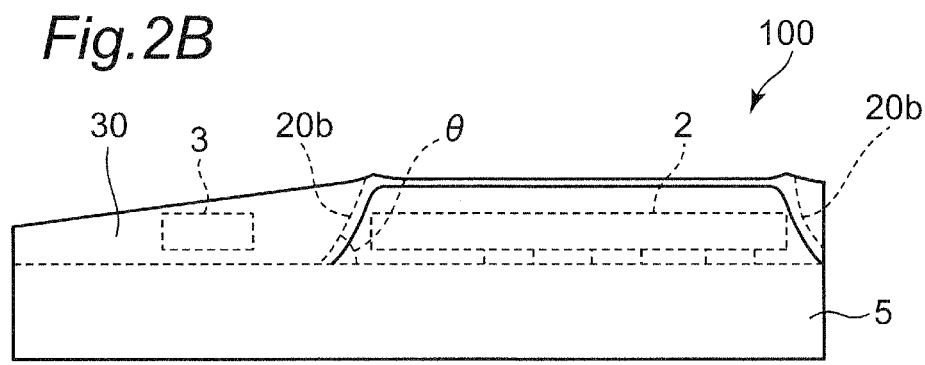
FIG. 2B is a schematic side view showing the structure of a light emitting device in the embodiment of the present invention.
Figure 2C:
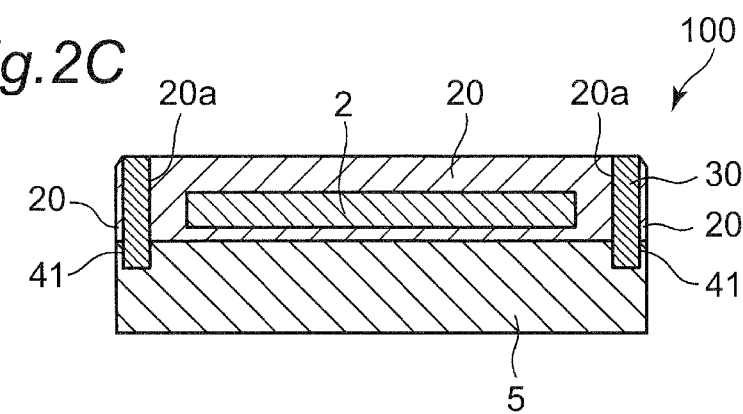
FIG. 2C is a schematic cross-sectional view taken along the line A-A' of the plan view of FIG. 2A.

Specifically, as shown in FIGS. 2B and 2C, a first side surface 20a of the first resin layer 20 along the longitudinal side of the light emitting device 100 and a second side surface 20b of the first resin layer 20 along the short side of the light emitting device 100 differ from each other in inclination angle with respect to the substrate 5. For example, the first side surface 20a of the first resin layer 20 has an inclination angle corresponding to a cut surface (sidewall) of the trench 41, and thus is substantially vertical with respect to the upper surface of the substrate 5. On the other hand, the second side surface 20b has an inclination angle depending on a formation method for forming the second resin layer 30, and, for example, is inclined such that an internal angle θ with respect to the upper surface of the substrate 5 is a sharp angle. Here, the internal angle θ means an angle formed by the second side surface 20b with respect to the upper surface of the substrate 5 inside the first resin layer 20. When intended to form the first resin layer 20 by the screen printing, the first side surface 20a has a substantially certain inclination angle regardless of a distance from the substrate, while the second side surface 20b has an inclination angle decreased from the position apart from the substrate toward the substrate 5 (with its internal angle being decreased).

Figure 4:
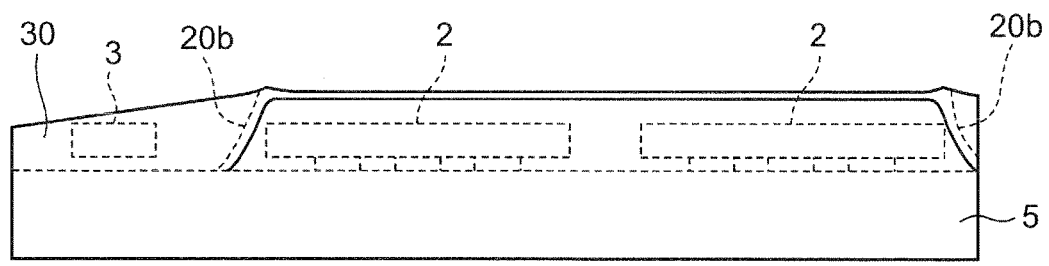
FIG. 4 is an schematic side view showing the structure of a light emitting device in another modified example of the present invention.
Figure 5:
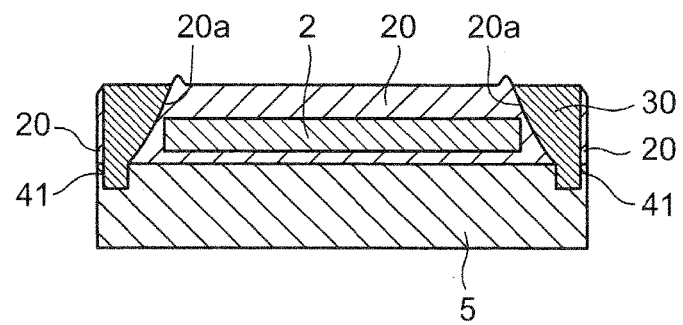
FIG. 5 is a cross-sectional view showing the shape of a first side surface fabricated when forming the first resin layer on each light emitting element in the embodiment of the present invention.

That is, after separation into the individual light emitting devices, the first resin layer 20 of each light emitting device has a trapezoidal quadrangular pyramid shape, whose upper surface is smaller in size than the bottom surface thereof on the substrate side. The "trapezoidal quadrangular pyramid shape" as used in the present specification also implies the shape in which only the second side surface 20b is inclined. For example, as shown in FIG. 5, when forming the first resin layer on each light emitting element 2 without continuously forming the first resin layer 20 in the strip-like shape, the first side surface 20a is also inclined like the second side surface 20b. In this way, the first resin layer can have its side surface inclined so as to render an upper surface side of the first resin layer smaller to thereby decrease the size of a light emitting portion, which can produce the light emitting device with good parting. FIG. 5 is a cross-sectional view of the light emitting device shown in FIG. 4, and corresponding to FIG. 2C.

In the above-mentioned embodiment, the first resin layer 20 is formed in the strip-like shape, and the first trenches 41 are formed in the direction perpendicular to the longitudinal direction of the strip-like shape. Thus, in the light emitting device 100 obtained by separation into the individual light emitting devices, the first resin layer has a rectangular planar view, and the first side surface 20a and the second side surface 20b correspond to two opposed sides of the rectangular shape respectively.

In the manufacturing method of the light emitting device in the embodiment mentioned above, as shown in FIG. 1G, each first separation trench 42 is formed between the adjacent unit regions 1 in the first direction, and is spaced apart from the first trench 41 to be separated therefrom. As a result, in the separated light emitting device 100, as shown in FIG. 2, the first resin layer 20 having a thickness corresponding to a distance between the first trench 41 and the first separation trench 42 is formed along the side surface parallel to its longitudinal direction.

Figure 3A:
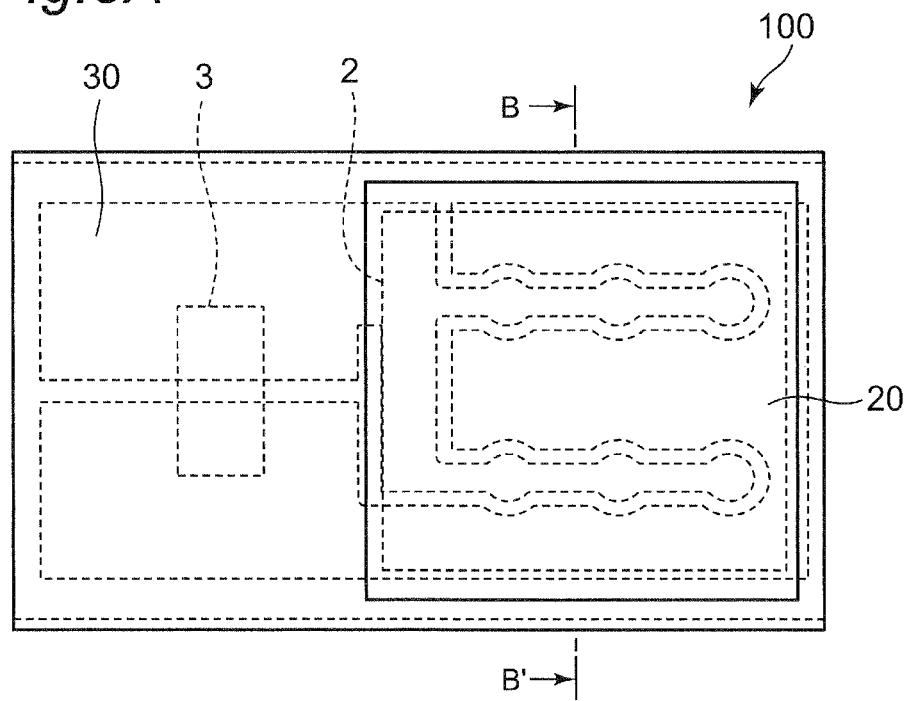
FIG. 3A is a schematic plan view showing the structure of a light emitting device in a modified example of the present invention.
Figure 3B:
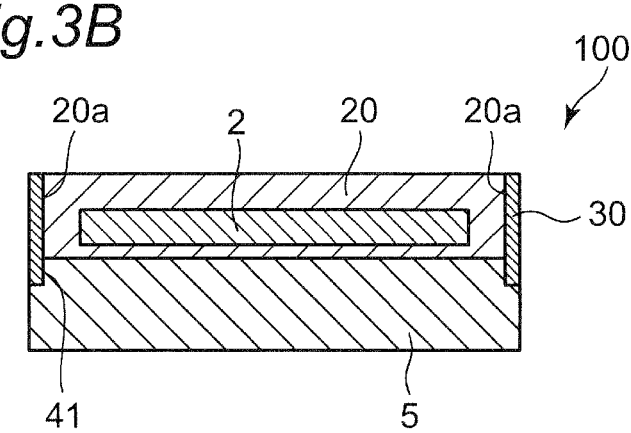
FIG. 3B is a schematic cross-sectional view taken along the line B-B' of the plan view of FIG. 3A.

However, the present invention is not limited thereto. Alternatively, a first separation trench having a wider width than the distance between the first trenches 41 may be formed to carry out separation into the individual light emitting devices 100. In this case, in the light emitting device separated, as shown in FIG. 3, the second resin layer is exposed without having the first resin layer 20 formed at its side surfaces parallel to the longitudinal direction.

It is apparent that in any one of the manufacturing methods of the light emitting device in this embodiment and in a modified example, the width of the first trench 41 and the width and position of the first separation trench 42 are set such that the second resin layer 30 having the required thickness is formed around the first resin layer 20 covering the light emitting element 2.

In the above embodiment, the light emitting device uses one light emitting element 20. The invention, however, is not limited thereto. Alternatively, the present invention can also be applied to two light emitting elements or a light emitting device using two or more light emitting elements, and a manufacturing method thereof. For example, FIGS. 4 and 5 show an example in which two light emitting elements 20 are used to configure the light emitting device. In an example shown in FIG. 4, two light emitting elements 2 are provided in each unit region. In the example shown in FIG. 4, for example, the first resin layer 20 for collectively covering the two light emitting elements 2 mounted in the unit region is continuously formed in the strip-like shape in one direction, whereby the light emitting device can be fabricated in the same way as that of the embodiment mentioned above. In such a case, the upper surface of the first resin layer may be formed in a concave shape between the two or more light emitting elements.

The connection of the light emitting elements may be series connection or parallel connection.

Preferred structures and materials for use in respective components in this embodiment will be described below.
(Substrate 5 (Aggregate Substrate 10))

Material for the substrate is preferably insulating material that hardly transmits the light emitted from the light emitting element or outside light. For example, suitable materials for the substrate can include ceramics such as alumina or aluminum nitride, and a resin such as a phenol resin, an epoxy resin, a polyimide resin, a BT resin, or polyphthalamide. In use of the resin for the substrate, an inorganic filler such as glass fiber, silicon oxide, titanium oxide, or alumina, may be mixed into the resin if necessary. This can improve the mechanical strength, reduce the coefficient of thermal expansion, and improve the optical reflectivity of the light emitting device. The low-temperature cofired ceramic (LTCC) can be suitably used for the light emitting device of the present invention because of high optical reflectivity.

(Light Emitting Element 2)

The light emitting element 2 is preferably a light emitting diode, whose wavelength can be arbitrarily selected according to applications. For example, a nitride semiconductor ($In_XAl_YGa_{1-X-Y}N$, $0 \leq X$, $0 \leq Y$, $X+Y \leq 1$) that can emit the light with a short wavelength to effectively excite the phosphor. The nitride semiconductor light emitting element is fabricated by forming a nitride semiconductor layer on a light transmissive substrate made of, for example, a sapphire substrate or the like. Thus, the wavelength of emission light can be selected from a wide variety of wavelengths of emission light depending on material of the semiconductor layer or a mixture ratio thereof.

(First Resin Layer)

Preferable material for the first resin layer is material having a high translucency, can be, for example, a thermosetting resin such as an epoxy resin or a silicone resin. The first resin layer preferably contains a phosphor, and if necessary, may have a diffusing agent, filler, or the like added thereto.

(Phosphor Contained in First Resin Layer)

A phosphor is selected according to the selected light emitting element 2.

Typical phosphors that can emit a white-based mixed colored light in appropriate combination with a blue-light-emitting element can include, for example, an yttrium aluminum garnet phosphor (YAG phosphor). In the case of the light emitting device that can emit white light, the concentration of the phosphor contained in the phosphor layer is adjusted such that the phosphor becomes white. The concentration of the phosphor is, for example, in a range of about 5% to about 50%.

In use of the blue-light-emitting element as the light emitting element, the YAG phosphor and a nitride-based phosphor containing a red component in a large amount can be used as the phosphor to generate an umber light. The umber color corresponds to a chromaticity range in a range including a long wavelength range of yellow and a short wavelength range of yellow-red in conformity with JIS-Z-8110, or a range sandwiched between a yellow wavelength range and a yellow-red short wavelength range of safety color in conformity with JIS-Z-9101. For example, the color chromaticity is a range positioned in a range of 580 nm to 600 nm as a dominant wavelength.

The term YAG phosphor becomes a generic name for a garnet structure containing components Y and Al. The YAG phosphor is a phosphor activated by at least one element selected from rare earth elements. The YAG is excited by blue light emitted from the light emitting element, and then emits light therefrom. For example, the YAG phosphor for use is preferably $(Re_{1-x}Sm_x)_3(Al_{1-y}Ga_y)_5O_{12}:Ce$ ($0 \leq x < 1$, $0 \leq y \leq 1$, provided that Re is at least one element selected from the group consisting of Y, Gd, La, and Lu).

The nitride-based phosphor is a phosphor that is activated by at least one rare earth element selected from the group consisting of Y, La, Ce, Pr, Nd, Sm, Eu, Gd, Tb, Dy, Ho, Er, and Lu, and which contains N, at least one II-group element selected from the group consisting of Be, Mg, Ca, Sr, Ba, and Zn, and at least one IV-group element selected from the group consisting of C, Si, Ge, Sn, Ti, Zr, and Hf. Alternatively or additionally, O may be contained in the nitride phosphor composition.

Specifically, the nitride-based phosphors can include a compound represented by a general formula: $L_XM_YN_{((2/3)X+(4/3)Y)}:R$, or $L_XM_YO_ZN_{((2/3)X+(4/3)Y-(2/3)Z)}:R$ (in which L is at least one II-group element selected from the group consisting of Be, Mg, Ca, Sr, Ba, and Zr; M is at least one IV-group element selected from the group consisting of C, Si, Ge, Sn, Ti, Zr, and Hf; and R is at least one rare earth element selected from the group consisting of Y, La, Ce, Pr, Nd, Sm, Eu, Gd, Tb, Dy, Ho, Er, and Lu, and in which X, Y, and Z satisfy the following relationships: $0.5 \leq X \leq 3$, $1.5 \leq Y \leq 8$, $0 < Z \leq 3$).

A KSF phosphor may be used as the phosphor that absorbs blue light to emit red light.

(Semiconductor Element 3)

The semiconductor element 3 is disposed adjacent to the light emitting element 2 on the substrate 5, separately from the light emitting element 2, if necessary. The semiconductor element 3 is, for example, flip-chip mounted. Such a semiconductor element can be a transistor for controlling the light emitting element, or a protective element to be mentioned later. The protective element is an element for protecting the light emitting element 2 from breakage or degradation of performance due to an excessive applied voltage. Specifically, the protective element is constituted of a Zener Diode which is adapted to be energized when a prescribed voltage or more is applied thereto. The protective element is a semiconductor element with a p-electrode and an n-electrode, like the light emitting element 2. The protective element is electrically connected to the light emitting element 2 so as to have its p-electrode and n-electrode in antiparallel to the p-electrode and n-electrode of the light emitting element 2. Like the light emitting element, the respective electrodes of the protective element are opposed to respective conductive members, followed by application of heat, ultrasonic wave, and load, so that the protective element is bonded to the conductive members.

Even though an excessive voltage is applied to between both p and n electrodes of the light emitting element 2 and exceeds a Zener voltage of the Zener diode, the Zener voltage is held between both p and n electrodes of the light emitting element 2, and then never be equal to or more than the Zener voltage. Thus, the provision of the protective element can prevent the voltage between both the p and n electrodes from being equal to or more than the Zener voltage, and thus can appropriately prevent the occurrence of element breakage or degradation of performance of the light emitting element 2 due to the excessive applied voltage.

(Second Resin Layer 30)

Suitable materials for the second resin layer 30 can include, for example, a thermosetting resin, a thermoplastic resin, and the like. More specifically, the resins can include a phenol resin, an epoxy resin, a BT resin, PPA, a silicone resin, and the like. Into the resin as a matrix, a powder of the reflective material (for example, $TiO_2$, $Al_2O_3$, $ZrO_2$, MgO) or the like is diffused. The reflective member has a refractive index that is very different from that of the resin as the matrix, and is less likely to absorb light from the light emitting element 2. The diffusion of the powder can effectively reflect the light.

The second resin layer 30 can be charged, for example, by use of a resin dispensing device that can move (or is movable) vertically or horizontally with respect to the aggregate substrate 10, on the upper side of the fixed aggregate substrate 10. That is, the resin dispensing device with the liquid resin charged thereinto is moved while discharging the resin from a nozzle at its tip end, whereby the second resin is charged into the vicinity of the light emitting element 2 and the semiconductor element 3. The movement velocity of the resin dispensing device can be appropriately adjusted according to the viscosity or temperature of the used resin. The discharge amount can be adjusted by keeping a pressure or the like constant during discharging.

DESCRIPTION OF REFERENCE NUMERALS

2 Light emitting element
3 Semiconductor element
5 Substrate
10 Aggregate substrate
20 First resin layer
20a First side surface
20b Second side surface
30 Second resin layer
41 Trench (first trench)
42 First separation trench
43 Second separation trench
100 Light emitting device

What is claimed is:

1. A method of manufacturing a light emitting device, the method comprising:
    a light emitting element mounting step comprising mounting a plurality of light emitting elements at predetermined intervals on a substrate so as to form a plurality of rows of light emitting elements;
    a Zener diode mounting step comprising mounting a plurality of Zener diodes on the substrate, each Zener diode corresponding to at least one of the light emitting elements;
    a first resin layer formation step comprising forming a plurality of first resin layers such that each first resin layer extends in a strip-like shape so as to directly cover the light emitting elements in a respective row;
    a trench formation step comprising forming a trench between adjacent light emitting elements in each of the rows, in a direction intersecting a direction in which the first resin layers extend; and
    a second resin charging step comprising charging a second resin into the trenches such that (i) upper surfaces of the first resin layers at positions above the light emitting elements are exposed from the second resin, and (ii) the second resin directly covers the Zener diodes.

2. The method according to claim 1, wherein a plurality of the trenches are formed between the adjacent light emitting elements in each of the rows.

3. The method according to claim 1, wherein each trench is formed to a depth that reaches midway through the substrate in a thickness direction of the substrate.

4. The method according to claim 1, further comprising a step of forming a separation trench between the adjacent light emitting elements in each of the rows, in the direction intersecting the direction in which the first resin layers extend.

5. The method according to claim 1, wherein the first resin layers are formed by screen printing.

6. The method according to claim 1, wherein, in the second resin charging step, the second resin is also charged in a gap between the first resin layers.

7. The method according to claim 1, wherein, in the Zener diode mounting step, the Zener diodes are mounted between the rows of light emitting elements.

8. The method according to claim 1, wherein the Zener diodes are mounted before the first resin formation step.

9. The method according to claim 1, wherein a width of a gap between the first resin layers is larger than a width of the trench.

10. The method according to claim 9, wherein, in the Zener diode mounting step, the Zener diodes are mounted between the rows of the light emitting elements.

11. The method according to claim 9, further comprising a step of forming a separation trench in the gap between the first resin layers.

12. The method according to claim 1, wherein the first resin is light transmissive and the second resin is light reflective.

13. The method according to claim 1, wherein the light emitting elements are mounted in flip-chip manner.

14. The method according to claim 1, further comprising a step of forming a resin frame surround a region in which the light emitting elements are mounted, before the second resin forming step.

15. The method according to claim 1, wherein the substrate includes an insulating member and a plurality of a pairs of electrodes.

16. The method according to claim 1, further comprising separating the substrate, with the light emitting elements, Zener diodes, first resin layers, and second resin thereon, into a plurality of light emitting devices, each including at least one of the light emitting elements and one of the Zener diodes.

17. The method according to claim 1, further comprising separating the substrate, with the light emitting elements, Zener diodes, first resin layers, and second resin thereon, into a plurality of light emitting devices, each including at least two of the light emitting elements and one of the Zener diodes.

* * * * *